(12) United States Patent
Kamigama et al.

(10) Patent No.: US 6,667,857 B2
(45) Date of Patent: Dec. 23, 2003

(54) HEAD GIMBAL ASSEMBLY HAVING A FLEXIBLE PRINTED CIRCUIT

(75) Inventors: Takehiro Kamigama, Tokyo (JP); Masashi Shiraishi, Tokyo (JP)

(73) Assignee: TDK Corporation, Tokyo (JP)

( * ) Notice: Subject to any disclaimer, the term of this patent is extended or adjusted under 35 U.S.C. 154(b) by 47 days.

(21) Appl. No.: 09/949,794

(22) Filed: Sep. 12, 2001

(65) Prior Publication Data
US 2002/0030940 A1 Mar. 14, 2002

(30) Foreign Application Priority Data
Sep. 12, 2000 (JP) ............................. 2000-276565

(51) Int. Cl.[7] ................................................ G11B 5/55
(52) U.S. Cl. ................................................ 360/245.9
(58) Field of Search ...................................... 360/245.9

(56) References Cited

U.S. PATENT DOCUMENTS

| | | | |
|---|---|---|---|
| 4,796,132 A | | 1/1989 | Dekura et al. |
| 5,245,489 A | * | 9/1993 | Kimura .................. 360/264.2 |
| 5,491,597 A | | 2/1996 | Bennin et al. |
| 5,612,840 A | * | 3/1997 | Hiraoka et al. .......... 360/245.9 |
| 5,844,751 A | | 12/1998 | Bennin et al. |
| 5,995,328 A | | 11/1999 | Balakrishnan |
| 6,057,986 A | * | 5/2000 | Takasugi ................. 360/245.9 |
| 6,125,015 A | | 9/2000 | Carlson et al. |
| 6,249,404 B1 | | 6/2001 | Doundakov et al. |

FOREIGN PATENT DOCUMENTS

| | | |
|---|---|---|
| JP | 09-016933 | 1/1997 |
| JP | 2001-067635 | 3/2001 |
| WO | 01/86641 | 11/2001 |

* cited by examiner

Primary Examiner—A. J. Heinz
(74) Attorney, Agent, or Firm—Burns, Doane, Swecker & Mathis, L.L.P.

(57) ABSTRACT

A head gimbal assembly includes a magnetic head slider with at least one thin-film magnetic head element, a support with a top end section fixed to the magnetic head slider, and a FPC member with trace conductors. One ends of the trace conductors are electrically connected to terminal electrodes of the at least one thin-film magnetic head element. The FPC member further includes a resin layer intimately fixed to a surface of the support with an adhesive, which resin layer has a thickness of 12.7 μm or less, and a trace conductor layer formed on the resin layer.

10 Claims, 3 Drawing Sheets

HEAD GIMBAL ASSEMBLY HAVING A FLEXIBLE PRINTED CIRCUIT

FIELD OF THE INVENTION

The present invention relates to a head gimbal assembly (HGA) including a suspension and a magnetic head slider provided with at least one thin-film magnetic head element and mounted on the suspension, used in for example a hard disk drive unit (HDD).

DESCRIPTION OF THE RELATED ART

In an HDD, thin-film magnetic head elements for writing magnetic information into and/or reading magnetic information from magnetic disks are in general formed on magnetic head sliders flying in operation above the rotating magnetic disks. The sliders are supported at top end sections of suspensions of HGAs, respectively.

In each suspension, one ends of a plurality of signal lines are electrically connected to a plurality of terminal electrodes of at least one thin-film magnetic head element formed on the magnetic head slider, respectively. The signal lines run along the suspension, and the other ends of these signal lines are electrically connected to external connection pads formed on the back end section or outside of the suspension, respectively.

Recently, a suspension using no lead wire for the signal lines, that is, a wireless suspension or a suspension using a flexible print circuit (FPC) has spread.

The wireless suspension may be configured by directly depositing a pattern of sequentially laminated resin layer, trace conductor layer and resin layer on the suspension as for signal lines, or by adhering to the suspension a separated stainless steel plate on which sequentially laminated resin layer, trace conductor layer and resin layer are preliminarily formed.

The suspension with FPC is configured by adhering on a normal suspension a FPC fabricated by forming trace conductors on a resin base layer and by forming a resin overcoat layer on the resin base layer to cover the trace conductors.

However, if an HGA is configured using a wireless suspension, because the wireless suspension itself is expensive in comparison with a normal suspension, the manufacturing cost of the HGA becomes extremely high.

If an HGA is configured using a suspension with FPC, although the HGA can be cheaply fabricated, a flying performance of the magnetic head slider will greatly deteriorate due to a large stiffness of the FPC. Particularly, since a recent micro magnetic head slider with for example a width of about 0.7 mm, a height of about 0.23 mm and a length of about 0.87 mm has an extremely small ABS area, if a spring constant of the suspension increases due to the high stiffness of the FPC, a good flying performance cannot be expected at all. Furthermore, the conventional HGA configured using a suspension with FPC is very weak to side winds due to its large thickness, and this exerts an influence upon the action of the suspension in operation.

SUMMARY OF THE INVENTION

It is therefore an object of the present invention to provide an HGA, whereby a low manufacturing cost can be attained and also a good flying performance can be expected even if a micro magnetic head slider is mounted thereon.

Another object of the present invention is to provide an HGA, whereby a low manufacturing cost can be attained and also a stable flying performance substantially unaffected by side winds can be expected.

According to the present invention, an HGA includes a magnetic head slider with at least one thin-film magnetic head element, a support with a top end section fixed to the magnetic head slider, and a FPC member with trace conductors. One ends of the trace conductors are electrically connected to terminal electrodes of the at least one thin-film magnetic head element. The FPC member further includes a resin layer intimately fixed to a surface of the support with an adhesive, which resin layer has a thickness of 12.7 $\mu$m or less, and a trace conductor layer formed on the resin layer.

Since the resin layer such as a polyimide layer has an extremely thin thickness of 12.7 $\mu$m (0.5 mil) or less, stiffness of the FPC member can be greatly lowered. As a result, an excellent flying performance of the magnetic head slider can be expected even if it is a micro magnetic head slider, and also it is used in a high-spindle rotation HDD. Furthermore, since the FPC member is thin and is intimately fixed to a surface of the support with the adhesive, it is possible to greatly decrease an influence of side winds resulting that a stable flying performance of the slider can be obtained. Thus, the HGA is adaptable to a high recording density HDD. It is a matter of course that using of the FPC as signal lines will provide an extremely cheap manufacturing cost in comparison with using of a wireless suspension.

It is preferred that both side edges of the FPC member are sealed with the adhesive. Thus, an influence of side winds with respect to the FPC member can be more reduced.

It is preferred that the support includes a base plate, a resilient hinge, a load beam coupled with the base plate through the hinge and a resilient flexure fixed to a top end section of the load beam, for mounting the magnetic head slider, or includes a base plate, a load beam coupled with the base plate and a resilient flexure fixed to a top end section of the load beam, for mounting the magnetic head slider.

It is also preferred that a part of the FPC member is intimately fixed to a surface of the flexure, and that the part of the FPC member only consists of the resin layer and the trace conductor layer formed on the resin layer.

It is further preferred that a part of the FPC member is intimately fixed to a surface of the load beam, and that the part of the FPC member consists of the resin layer, the trace conductor layer formed on the resin layer and an overcoat layer formed to cover the trace conductor layer.

It is preferred that the resin layer is a polyimide layer.

It is preferred that the end of the trace conductors is ball bonded with the terminal electrodes of the at least one thin-film magnetic head element.

In an embodiment according to the present invention, the magnetic head slider may be a micro magnetic head slider with a width of 1.0 mm or less, a height of 0.3 mm or less and a length of 1.0 mm or less.

Further objects and advantages of the present invention will be apparent from the following description of the preferred embodiments of the invention as illustrated in the accompanying drawings.

DESCRIPTION OF THE PREFERRED EMBODIMENTS

Figure 1:
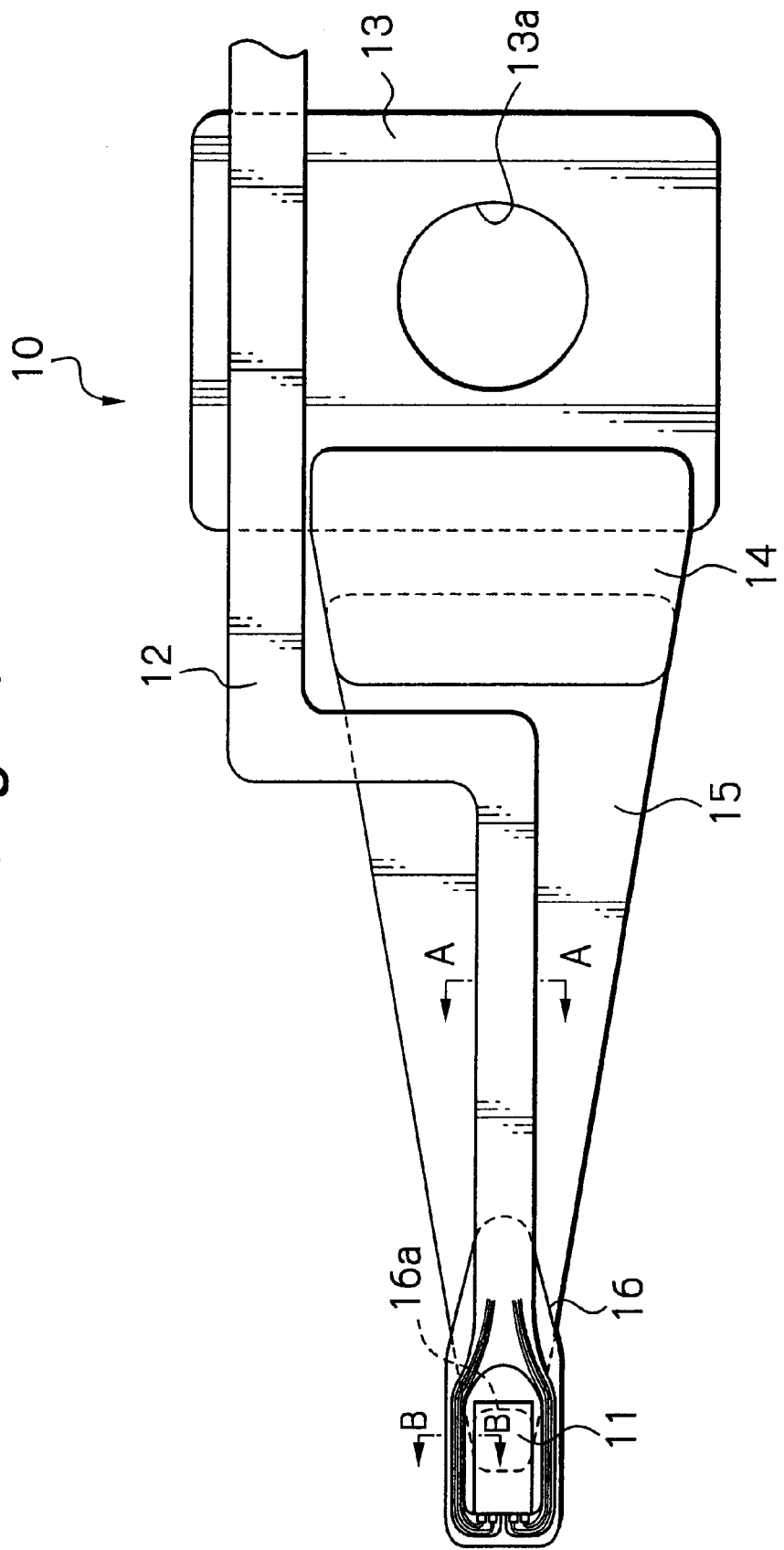
FIG. 1 is a plane view schematically illustrating the whole structure of an HGA seen from its slider-mounting surface in a preferred embodiment according to the present invention.
Figure 2:
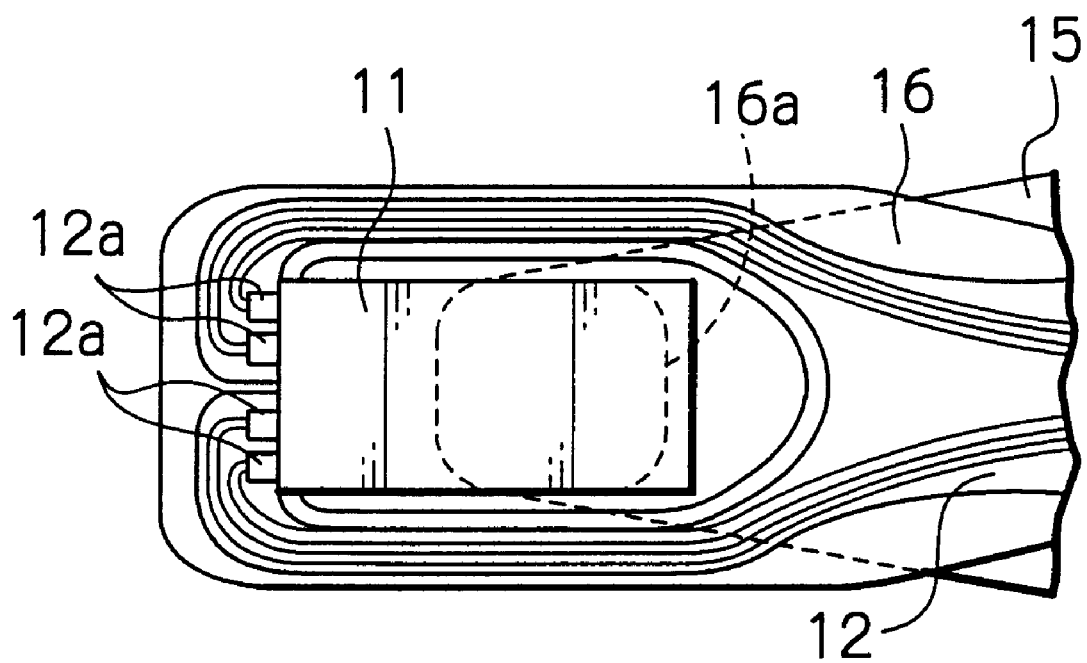
FIG. 2 is an enlarged view illustrating a top end section of the HGA in the embodiment of FIG. 1.
Figure 3:
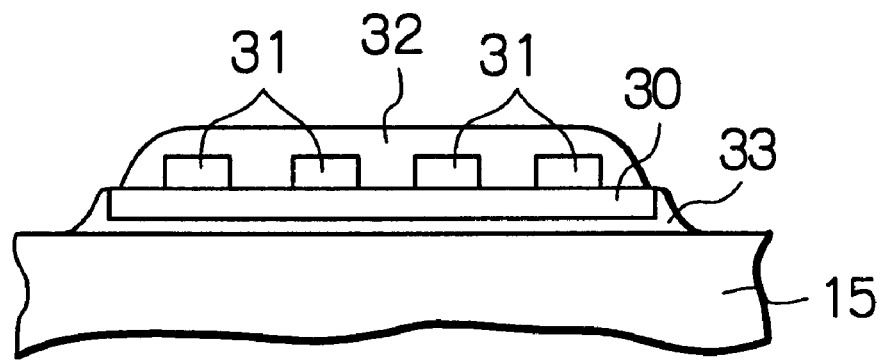
FIG. 3 is a A—A line sectional view of FIG. 1.
Figure 4:
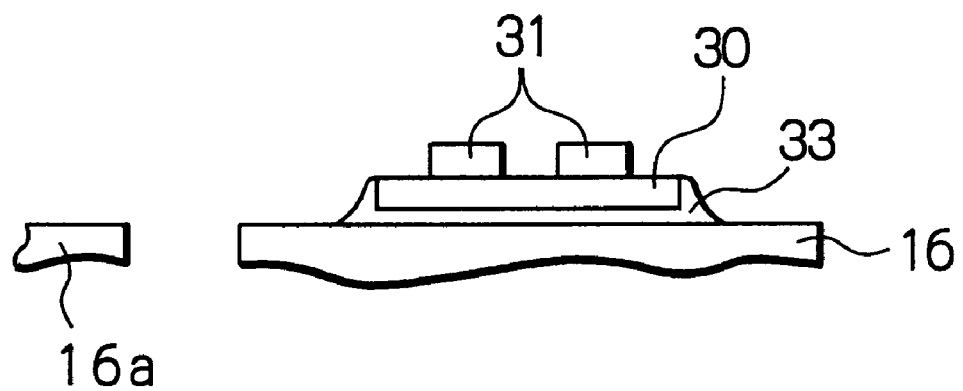
FIG. 4 is a B—B line sectional view of FIG. 1.

FIG. 1 schematically illustrates the whole structure of an HGA seen from its slider-mounting surface in a preferred embodiment according to the present invention, FIG. 2 illustrates a top end section of the HGA in this embodiment, FIG. 3 illustrates a A—A line section of FIG. 1, and FIG. 4 illustrates a B—B line section of FIG. 1.

As shown in FIGS. 1 and 2, the HGA in this embodiment has a suspension 10 on which a FPC 12 is adhered, and a micro magnetic head slider 11 with at least one thin-film magnetic head element fixed to a top end section of the suspension 10. Terminal electrodes of the thin-film magnetic head element are electrically connected to connection pads 12a formed on the FPC 12 by ball bonding using for example Au balls or solder balls.

The suspension 10 itself is substantially formed by a base plate 13 with an attaching section 13a used to fix with a drive arm (not shown), a resilient hinge 14, a load beam 15 coupled with the base plate 13 through the hinge 14 and a resilient flexure 16 fixed to a top end section of the load beam 15 for mounting the magnetic head slider 11 thereon.

The base plate 13 is made of in this embodiment a stainless steel or iron plate and fixed to one end section of the hinge 14 by welding. The HGA is attached to the drive arm by fixing the base plate 13 at its attaching section 13a.

The hinge 14 is made of in this embodiment a stainless steel plate (for example SUS304TA) with a thickness of about 38 $\mu$m and has a small spring constant for easily adjusting the load gram. Namely, the hinge 14 has elasticity providing, to the load beam 15, a force for pressing the magnetic head slider 11 toward the direction of a magnetic disk surface in operation.

The load beam 15 is fixed to the other end section of the hinge 14 by welding. This load beam 15 has a width getting narrow toward its top end and is made of in this embodiment a stainless steel plate (for example SUS304TA) with a large thickness of about 100 $\mu$m. Since the thickness is relatively larger than that of the conventional load beam, this load beam 15 is relatively rigid and no deformation will occur. Also, since side edges are formed in flat with no bending, this load beam 15 will be substantially insensitive to side winds.

The flexure 16 has a flexible tongue 16a depressed by a dimple (not shown) formed on the load beam 15 and has elasticity for flexibly supporting by this tongue 16a the magnetic head slider 11 to provide a free attitude to the slider. The flexure 16 is made of in this embodiment a stainless steel plate (for example SUS304TA) with a thickness of about 20 $\mu$m.

The fixing of the base plate 13 with the hinge 14, of the hinge 14 with the load beam 15 and of the load beam 15 with the flexure 16 are performed by pinpoint welding at a plurality of points.

Parts of the FPC 12 are closely and intimately adhered to the surfaces of the base plate 13, load beam 15 and the flexure 16 with an adhesive. This FPC 12 is floated in space between the base plate 13 and the load beam 15 and behind the base plate 13. Also this FPC 12 has somewhat different structure at a section fixed to the top end section of the flexure 16 from other section.

As shown in FIG. 3, in the other section, namely in the section fixed to the base plate 13 or the load beam 15 and the floating section, the FPC 12 is configured by a thin insulation material layer (base film layer) 30 made of a resin such as polyimide, a trace conductor layer 31 of Cu formed on the base film layer 30 and an insulation material layer (overcoat layer) 32 made of a resin such as polyimide for covering the trace conductor layer 31. The base film layer 30 of the FPC 12 is intimately adhered to the surface of the load beam 15 with for example a UV resin or epoxy resin adhesive 33. Also, although it is not illustrated, the base film layer 30 of the FPC 12 is intimately adhered to the surface of the base plate 13 with the adhesive 33.

On the other hand, as shown in FIG. 4, in the section fixed to the top end section of the flexure 16, the FPC 12 is configured only by a thin insulation material layer (base film layer) 30 made of a resin such as polyimide and a trace conductor layer 31 made of Cu with a plated Au for protecting Cu from corrosion damage and formed on the base film layer 30, but no overcoat layer is formed. The base film layer 30 of the FPC 12 is intimately adhered to the surface of the flexure 16 with for example a UV resin or epoxy resin adhesive 33. Since the FPC 12 has no overcoat layer at this section that will exert an influence upon a spring constant, the FPC 12 with a lower stiffness can be provided.

The base film layer 30 has an extremely thin thickness of 12.7 $\mu$m (0.5 mil) or less, for example of about 12.7 $\mu$m, over the whole FPC 12. A thickness of the trace conductor 31 is about 18 $\mu$m. Due to such extremely thin thickness of the base film layer 30, stiffness of the FPC 12 can be greatly lowered. As a result, an excellent flying performance of the magnetic head slider 11 can be expected even if it is a micro magnetic head slider with a width of 1.0 mm or less (for example about 0.7 mm), a height of 0.3 mm or less (for example about 0.23 mm) and a length of 1.0 mm or less (for example about 0.87 mm), and also it is used in a high-spindle rotation HDD.

Furthermore, since the FPC 12 is thin and is intimately adhered to the surface of the suspension 10 with the adhesive, it is possible to greatly decrease an influence of side winds resulting that a stable flying performance of the slider can be obtained. Thus, the HGA is adaptable to a high recording density HDD. It is a matter of course that using of the FPC as signal lines will provide an extremely cheap manufacturing cost in comparison with using of a wireless suspension.

Stiffness simulations were actually carried out for an HGA with FPC having a base film layer thickness of 25.4 $\mu$m (1.0 mil), that is almost the same thickness of the conventional FPC, and for an HGA with FPC having a base film layer thickness of 12.7 $\mu$m (0.5 mil). As a result, it was confirmed that a pitch stiffness would decrease by about 31% and a roll stiffness would decrease by about 13% when the base film layer thinned from 25.4 $\mu$m to 12.7 $\mu$m.

A flying height of the aforementioned micro magnetic head slider is susceptible to the pitch stiffness. Namely, variation of the flying height of this micro magnetic head slider in operation is improved by 0.08 nm in the standard deviation $\sigma$, when the pitch stiffness decreases by 0.1 $\mu$N/deg. When the base film layer is thinned from 25.4 $\mu$m to 12.7 $\mu$m, a normal pitch stiffness of about 0.7 will lower by about 0.21. This corresponds to an improvement of 0.16 nm in the standard deviation $\sigma$ of variation of the flying height. A target flying height of such micro magnetic head slider is now around 10–15 nm. Thus, if the variation is represented in 3$\sigma$, the above mentioned improvement of 0.16 nm in $\sigma$ corresponds to 3–5% gain with respect to a nominal value. This is a sufficiently satisfied gain.

If the base film layer 30 of the FPC 12 is thinned less than 12.7 $\mu$m within a range keeping the electrical insulation, the stiffness decreases lower and thus variation in the flying height becomes smaller resulting the flying performance of the slider to improve more.

As shown in FIGS. 3 and 4, the adhesive 33 is filled up so that both side edges of the base film layer 30 are covered completely without a crevice, and the adhesive 33 seals this section. Therefore, an influence of side winds with respect to the FPC 12 becomes quite small.

In the aforementioned embodiment, the suspension 10 has a four-pieces structure with the base plate 13, the hinge 14, the load beam 15 and the flexure 16 or a five-pieces structure if the FPC 12 is added. However, the suspension according to the present invention is not limited to this structure but may be configured by a three-pieces structure with a base plate, load beam and a flexure or a four-pieces structure if a FPC is added, or a two-pieces structure with a base plate and a flexure-load beam or a three-pieces structure if a FPC is added.

Although the FPC 12 in the aforementioned embodiment has a long tail structure where its rear end extends beyond the base plate 13, the FPC according to the present invention is not limited to this structure but may have a structure where the rear end of the FPC terminates at the base plate.

Many widely different embodiments of the present invention may be constructed without departing from the spirit and scope of the present invention. It should be understood that the present invention is not limited to the specific embodiments described in the specification, except as defined in the appended claims.

What is claimed is:

1. A head gimbal assembly comprising:

a magnetic head slider with at least one thin-film magnetic head element;

a resilient suspension with a top end section fixed to said magnetic head slider; and a FPC (flexible printed circuit) member with a resin layer and trace conductors formed on said resin layer, one end of said trace conductors being electrically connected to terminal electrodes of said at least one thin-film magnetic head element, wherein said FPC member is separately formed from said suspension and said resin layer of the FPC member is intimately adhered to a surface of said suspension with an adhesive, and wherein side edges of said FPC member are sealed with said adhesive.

2. The head gimbal assembly as claimed in claim 1, wherein a number of layers of said FPC member adhered to a surface of the top end section of said suspension is different from a remaining section of said FPC member.

3. The head gimbal assembly as claimed in claim 1, wherein said suspension comprises a base plate, a resilient hinge, a load beam coupled with said base plate through said hinge and a resilient flexure fixed to a top end section of said load beam, for mounting said magnetic head slider.

4. The head gimbal assembly as claimed in claim 3, wherein a part of said FPC member intimately fixed to a surface of said flexure only consists of said resin layer and said trace conductors formed on said resin layer.

5. The head gimbal assembly as claimed in claim 3, wherein a part of said FPC member intimately fixed to a surface of said load beam consists of said resin layer, said trace conductors formed on said resin layer and an overcoat layer formed to cover said trace conductors.

6. The head gimbal assembly as claimed in claim 1, wherein said suspension comprises a base plate, a load beam coupled with said base plate and a resilient flexure fixed to a top end section of said load beam, for mounting said magnetic head slider.

7. The head gimbal assembly as claimed in claim 6, wherein a part of said FPC member intimately fixed to a surface of said flexure only consists of said resin layer and said trace conductors formed on said resin layer.

8. The head gimbal assembly as claimed in claim 6, wherein a part of said FPC member intimately fixed to a surface of said load beam consists of said resin layer, said trace conductors formed on said resin layer and an overcoat layer formed to cover said trace conductors.

9. The head gimbal assembly as claimed in claim 1, wherein said resin layer is a polyimide layer.

10. The head gimbal assembly as claimed in claim 1, wherein said magnetic head slider is a micro magnetic head slider with a width not greater than 1.0 mm, a height not greater than 0.3 mm and a length not greater than 1.0 mm.

* * * * *